United States Patent
Zafiropoulo et al.

(10) Patent No.: US 8,986,562 B2
(45) Date of Patent: Mar. 24, 2015

(54) METHODS OF LASER PROCESSING PHOTORESIST IN A GASEOUS ENVIRONMENT

(71) Applicant: Ultratech, Inc., San Jose, CA (US)

(72) Inventors: Arthur W. Zafiropoulo, Atherton, CA (US); Andrew M. Hawryluk, Los Altos, CA (US)

(73) Assignee: Ultratech, Inc., San Jose, CA (US)

( * ) Notice: Subject to any disclaimer, the term of this patent is extended or adjusted under 35 U.S.C. 154(b) by 26 days.

(21) Appl. No.: 13/961,655

(22) Filed: Aug. 7, 2013

(65) Prior Publication Data

US 2015/0041431 A1 Feb. 12, 2015

(51) Int. Cl.
| | | |
|---|---|---|
| B44C 1/22 | (2006.01) |
| C03C 15/00 | (2006.01) |
| C03C 25/68 | (2006.01) |
| C23F 1/00 | (2006.01) |
| H01L 21/027 | (2006.01) |
| H01L 21/308 | (2006.01) |
| H01L 21/3065 | (2006.01) |

(52) U.S. Cl.
CPC ........ H01L 21/0275 (2013.01); H01L 21/3086 (2013.01); H01L 21/3065 (2013.01)
USPC .......................................................... 216/48

(58) Field of Classification Search
USPC ................................. 216/48, 49, 67
See application file for complete search history.

(56) References Cited

U.S. PATENT DOCUMENTS

| | | |
|---|---|---|
| 2,841,477 A | 7/1958 | Hall |
| 4,260,649 A | 4/1981 | Denison et al. |
| 4,590,149 A | 5/1986 | Nakane et al. |
| 4,749,436 A | 6/1988 | Minato et al. |
| 4,841,342 A | 6/1989 | Suzuki et al. |
| 4,851,691 A | 7/1989 | Hanley |
| 4,868,095 A | 9/1989 | Suzuki et al. |
| 4,888,271 A | 12/1989 | Suzuki et al. |
| 4,900,938 A | 2/1990 | Suzuki et al. |
| 5,648,198 A | 7/1997 | Shibata |
| 6,162,591 A | 12/2000 | Gao et al. |
| 6,210,868 B1 | 4/2001 | Yoshii |
| 6,620,574 B2 | 9/2003 | Campbell et al. |
| 6,709,986 B2 | 3/2004 | Lee et al. |
| 7,125,496 B2 | 10/2006 | Lee |
| 7,732,122 B2 | 6/2010 | Wong et al. |
| 2002/0110760 A1 | 8/2002 | Lin |
| 2009/0130608 A1 | 5/2009 | Irving et al. |

(Continued)

OTHER PUBLICATIONS

Peng et al., "Nanoscopic patterned materials with tunable dimensions via atomic layer deposition on block copolymers," *Adv. Mater.* 2010, 22, 5129-5133.

(Continued)

*Primary Examiner* — Roberts Culbert
(74) *Attorney, Agent, or Firm* — Opticus IP Law PLLC

(57) ABSTRACT

Methods of laser processing photoresist in a gaseous environment to improve at least one of etch resistance and line-edge roughness are disclosed. The methods include sequentially introducing first and second molecular gases to the photoresist surface and performing respective first and second laser scanning of the surface for each molecular gas. The first molecular gas can be trimethyl aluminum, titanium tetrachloride or diethyl zinc, and the second molecular gas comprises water vapor. Short dwell times prevent the photoresist from flowing while serving to speed up the photoresist enhancement process.

33 Claims, 4 Drawing Sheets

(56) References Cited

U.S. PATENT DOCUMENTS

2010/0248476 A1   9/2010   Sera et al.
2012/0241411 A1*  9/2012   Darling et al. ................ 216/67
2013/0171571 A1   7/2013   Dunn et al.

OTHER PUBLICATIONS

Tseng et al., "Enhanced polymeric lithography resists via sequential infiltration synthesis," *J. Mater. Chem.*, 21, 2011 pp. 11722-25 (also cited as DOI: 10.1039/c1jm12461g).

Peng et al, "A route to nanoscopic material via sequential infiltration synthesis on block copolymer templates," published online at www.acsnano.org, 10.1021/nn2003234.

Jung et al., "Deprotection reaction kinetics in chemically amplified photoresists obtained from sub-milisecond post exposure bake," SPIE Advanced Lithography, Feb. 12, 2012.

Search Report from Intellectual Property Office of Singapore for Application No. 10201406175T, which is the Singapore counterpart application to the above-identified U.S. Application.

* cited by examiner

METHODS OF LASER PROCESSING PHOTORESIST IN A GASEOUS ENVIRONMENT

FIELD

The present disclosure relates to photoresist processing, and in particular relates to systems and methods for processing a photoresist using laser processing and a gaseous environment to improve photoresist properties.

BACKGROUND

Photoresist is a photosensitive material used in semiconductor manufacturing in connection with forming small features in silicon in the process of forming a semiconductor device. As used in photolithography, a silicon wafer is coated with photoresist and placed in the photolithography tool. The particular pattern to be formed in the silicon wafer is embodied in a mask and the mask illuminated. The mask image is projected onto the photoresist, which is sensitive to the wavelength of illumination. The photoresist is then developed so that exposed portions of the photoresist are removed (for "positive" photoresist), leaving a copy of the mask pattern in the photoresist. The patterned photoresist is then etched, which transfers the pattern into the silicon wafer or other material under the photoresist.

Ideally, the photoresist pattern is binary in nature, having perfectly square sidewalls. Moreover, the ideal photoresist is able to replicate the mask image with perfect fidelity and serves as a perfect etch barrier. In practice, photoresist has a limited sensitivity, has some degree of line-edge roughness (LER) and is an imperfect etch barrier.

Efforts have been made to improve photoresist sensitivity, reduce LER and increase the etch resistance. In one case, sequential infiltration synthesis (SIS) is performed using trimethyl aluminum and water at temperatures of less than 100° C. for several minutes to increase etch resistance and reduce LER. This process is described in the publication by Tseng et al., "Enhanced polymeric lithography resists via sequential infiltration synthesis," J. Mater. Chem., 21, 2011 pp. 11722-25 (also cited as DOI: 10.1039/c1jm12461g).

Unfortunately, the several minutes it takes to carry out this process reduces wafer throughput at the manufacturing line.

SUMMARY

An aspect of the disclosure is a method of improving on a patterned product wafer at least one of an etch resistance and a line-edge roughness of a photoresist layer having a surface. The method includes: a) exposing the photoresist layer to a first process gas comprising either trimethyl aluminum ($Al_2(CH_3)_6$) gas, titanium tetrachloride ($TiCL_4$) gas or diethyl zinc (($C_2H_5)_2Zn$) gas; b) laser irradiating the photoresist layer and the first process gas to cause the first process gas to infuse into the photoresist layer, wherein the photoresist surface is raised to a temperature of between 300° C. and 500° C. with a temperature uniformity of +/−5° C.; c) removing remaining first process gas from a vicinity of the photoresist layer; d) exposing the photoresist layer to a second process gas comprising $H_2O$; and e) laser irradiating the photoresist layer and second process gas to cause the $H_2O$ to infuse into the photoresist layer, wherein the photoresist surface is raised to a temperature of between 300° C. and 500° C. with a temperature uniformity of +/−5° C.

Another aspect of the disclosure is the method described above, wherein the laser irradiating includes scanning a laser beam over the surface of the photoresist layer.

Another aspect of the disclosure is the method described above, wherein the scanning includes either moving the laser beam, moving the patterned product wafer or moving both the laser beam and the patterned product wafer.

Another aspect of the disclosure is the method described above, wherein the laser beam forms a line image at the photoresist surface.

Another aspect of the disclosure is the method described above, wherein the line image has a dwell time $\tau$ in the range $1 \leq \tau \leq 100$ ms.

Another aspect of the disclosure is the method described above, wherein the line image has a width W in the range $0.2$ mm$\leq$W$\leq$2 mm and a length L in the range 10 mm$\leq$L$\leq$100 mm.

Another aspect of the disclosure is the method described above, wherein the line image has a scan speed $v_s$ in the range 20 mm/s$\leq v_s \leq$5,000 mm/s.

Another aspect of the disclosure is the method described above, wherein the laser beam has a power density P in the range 50 watts/cm$^2 \leq$P$\leq$150 watts/cm$^2$.

Another aspect of the disclosure is the method described above, wherein the patterned product wafer is maintained in an interior of a process chamber.

Another aspect of the disclosure is the method described above, further comprising etching the processed patterned product wafer.

Another aspect of the disclosure is the method described above, wherein steps a) through e) are carried out over the entire wafer in a wafer process time of between 30 seconds and 120 seconds.

Another aspect of the disclosure is the method described above, wherein steps a) through e) are repeated one or more times, with an additional step of removing the second process gas from the vicinity of the photoresist layer after each step e).

Another aspect of the disclosure is the method described above, wherein the produce wafer resides within a process chamber interior, and wherein removing the first process gas from the vicinity of the photoresist layer includes at least one of evacuation of the first process gas from the chamber interior and purging the chamber interior with an inert gas.

Another aspect of the disclosure is a method of processing a product wafer residing in an interior of a process chamber and having a patterned photoresist layer with a surface to improve at least one of an etch resistance and a line-edge roughness. The method includes: a) exposing the surface of the photoresist layer to a first molecular process gas; b) scanning a laser beam over the surface of the photoresist layer to cause infusion of molecules of the first molecular process gas into the photoresist layer, wherein the photoresist surface is raised to a temperature of between 300° C. and 500° C. with a temperature uniformity of +/−5° C.; c) removing remaining first molecular process gas from the chamber interior; d) exposing the photoresist layer to a second molecular process gas and repeating step b) for the second molecular process gas; and wherein the first molecular process gas is one of trimethyl aluminum ($Al_2(CH3)_6$) gas, titanium tetrachloride ($TiCL_4$) gas or diethyl zinc (($C_2H_5)_2Zn$) gas, and the second molecular process gas comprises $H_2O$.

Another aspect of the disclosure is the method described above, wherein the laser beam forms a line image at the photoresist surface, and wherein the line image has a dwell time $\tau$ in the range 1 ms$\leq \tau \leq$100 ms.

Another aspect of the disclosure is the method described above, wherein the line image has a width W in the range 0.2 mm≤W≤2 mm and a length L in the range 10 mm≤L≤100 mm.

Another aspect of the disclosure is the method described above, wherein the line image has a scan speed $v_s$ in the range 20 mm/s≤$v_s$≤5,000 mm/s.

Another aspect of the disclosure is the method described above, wherein the laser beam has a power density P in the range 50 watts/cm$^2$≤P≤150 watts/cm$^2$.

Another aspect of the disclosure is the method described above, further comprising etching the processed patterned product wafer.

Another aspect of the disclosure is the method described above, wherein steps a) through d) are carried out over the entire wafer in a wafer process time of between 30 seconds and 120 seconds.

Another aspect of the disclosure is the method described above, wherein removing the first molecular process gas from the chamber interior includes at least one of evacuation of the first molecular process gas from the chamber interior and purging the chamber interior with an inert gas.

Another aspect of the disclosure is a method of processing a product wafer residing in an interior of a process chamber and having a patterned photoresist layer having a surface to improve at least one of an etch resistance and a line-edge roughness. The method includes: a) sequentially introducing first and second molecular process gases to the process chamber interior, including removing the first or second molecular process gas from the process chamber interior prior to introducing the other of the first or second molecular process gas; b) laser scanning the photoresist surface for each of the first and second molecular gases to cause the sequential infusion of the first and second molecular gases into the photoresist layer; and c) repeating steps a) and b) multiple times, wherein the first molecular gas is either trimethyl aluminum (Al$_2$(CH3)$_6$), titanium tetrachloride (TiCL$_4$) or diethyl zinc (C$_2$H$_5$)$_2$Zn), and the second molecular gas comprises water vapor.

Another aspect of the disclosure is the method described above, wherein the laser scans are performed using a laser beam that forms a line image, and wherein the line image has a dwell time τ in the range 1 ms≤τ≤100 ms.

Another aspect of the disclosure is the method described above, wherein the line image has a width W in the range 0.2 mm≤W≤2 mm and a length L in the range 10 mm≤L≤100 mm.

Another aspect of the disclosure is the method described above, wherein the line image has a scan speed $v_s$ in the range 20 mm/s≤$v_s$≤5,000 mm/s.

Another aspect of the disclosure is the method described above, wherein the laser beam has a power density P in the range 50 watts/cm$^2$≤P≤150 watts/cm$^2$.

Another aspect of the disclosure is the method described above, wherein removing the first or second molecular process gas from the chamber interior includes at least one of: i) evacuation of the first or second molecular process gas from the chamber interior and ii) purging the chamber interior with an inert gas.

Another aspect of the disclosure is a method of processing a product wafer residing in an interior of a process chamber and having a patterned photoresist layer having a surface to improve at least one of an etch resistance and a line-edge roughness. The method includes: a) exposing the surface of the photoresist layer to a first process gas comprising molecules, wherein the first process gas molecules are selected from the group of molecules comprising: trimethyl aluminum (Al$_2$(CH3)$_6$) gas, titanium tetrachloride (TiCL$_4$) gas or diethyl zinc ((C$_2$H$_5$)$_2$Zn) gas; and b) scanning a laser beam over the surface of the photoresist layer to cause infusion of the molecules of the first process gas into the photoresist layer, wherein the photoresist surface is raised to a temperature of between 300° C. and 500° C. with a temperature uniformity of +/−5° C.

Another aspect of the disclosure is the method described above, further comprising after step b): c) removing the first process gas from the chamber interior; d) exposing the photoresist layer to a second process gas containing H$_2$O molecules; and e) scanning the laser beam over the surface of the photoresist layer to cause infusion of the H$_2$O molecules into the photoresist layer.

Another aspect of the disclosure is the method described above, wherein removing the first process gas from the chamber interior includes at least one of: i) evacuation of the first or second molecular process gas from the chamber interior and ii) purging the chamber interior with an inert gas.

Another aspect of the disclosure is the method described above, wherein scanning laser beam forms a line image having a dwell time τ in the range 1 ms≤τ≤100 ms.

Another aspect of the disclosure is the method described above, wherein the line image has a width W in the range 0.2 mm≤W≤2 mm, a length L in the range 10 mm≤L≤100 mm, a scan speed $v_s$ in the range 20 mm/s≤$v_s$≤5,000 mm/s, and a power density P in the range 50 watts/cm$^2$≤P≤150 watts/cm$^2$.

Another aspect of the disclosure is the method described above, wherein steps a) and b) are carried out over the entire product wafer in a wafer process time of between 30 seconds and 120 seconds.

Additional features and advantages will be set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary and are intended to provide an overview or framework for understanding the nature and character of the claims.

BRIEF DESCRIPTION OF THE DRAWINGS

The accompanying drawings are included to provide a further understanding and are incorporated into and constitute a part of this specification. The drawings illustrate one or more embodiment(s) and together with the Detailed Description serve to explain the principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

The entire disclosure of any publication or patent document mentioned herein is incorporated by reference.

Cartesian coordinates are shown in some of the Figures for the sake of reference and are not intended to be limiting as to direction or orientation.

Figure 1:
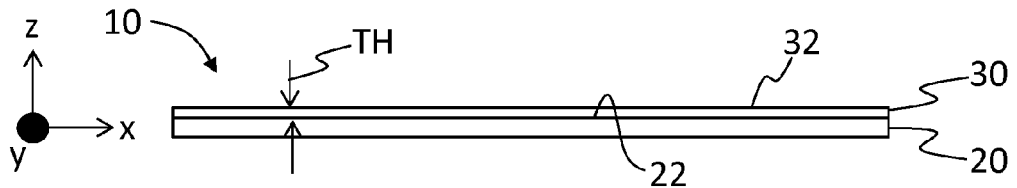
FIG. 1 is a cross-sectional view of an example product wafer that includes a silicon substrate coated with a layer of photoresist.
Figure 2:
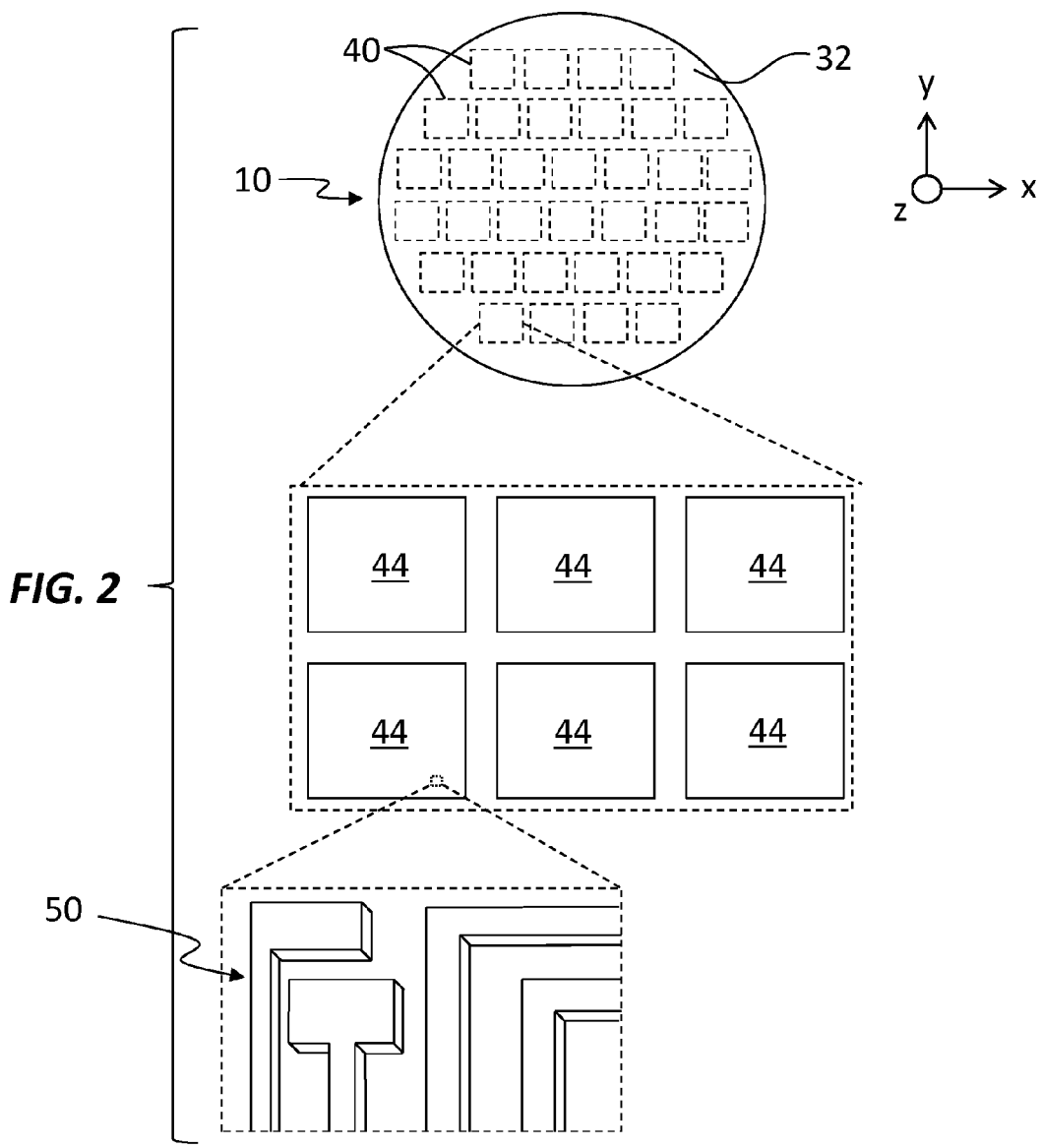
FIG. 2 is a top-down view of the product wafer of FIG. 1 and shows how the product wafer includes exposure fields and patterns with each exposure field.

FIG. 1 is a cross-sectional view and FIG. 2 is a top-down view of an example product wafer 10. The product wafer 10 includes a silicon substrate 20 having a top surface 22. The substrate top surface 22 is coated with a layer of photoresist 30 that has a top surface 32 and a thickness TH. With reference to FIG. 2, product wafer 10 includes an array of exposure fields ("fields") 40 that is formed by the photolithographic exposure of photoresist 30 on a field-by-field or multiple-field basis. In an example, exposure fields 40 comprise subregions that define the boundaries for subsequent integrated circuit (IC) chips 44 (first close-up inset) that are formed when the fabrication of product wafer 10 is completed. The product wafer 10 as shown represents a semiconductor wafer during the IC fabrication process.

The photoresist 30 records in each field 40 an image of the pattern features on a photolithography reticle imaged in the photoresist layer using a photolithographic imaging system or "tool," as it is often referred to in the industry. An example photolithography tool is described for example in U.S. Pat. No. 6,879,383. Thus, product wafer 10 is said to be "exposed" when all fields 40 are formed.

The exposed product wafer 10 is then subjected to a develop process that removes the unexposed photoresist 30 (in the case of "positive" photoresist). The result is that each field 40 now includes the same three-dimensional photoresist pattern 50, as shown in the second close-up inset of FIG. 1. The product wafer 10 at this stage of the process can be referred to as a "patterned product wafer."

In the usual next step, patterned product wafer 10 is subjected to an etching process that etches photoresist pattern 50 into the underlying silicon substrate. This is accomplished by photoresist pattern 50 serving as an etch-stopping structure.

As noted above, photoresist 30 has performance limitations relating to, among other things, line edge roughness (LER) and etch resistance.

Figure 3:
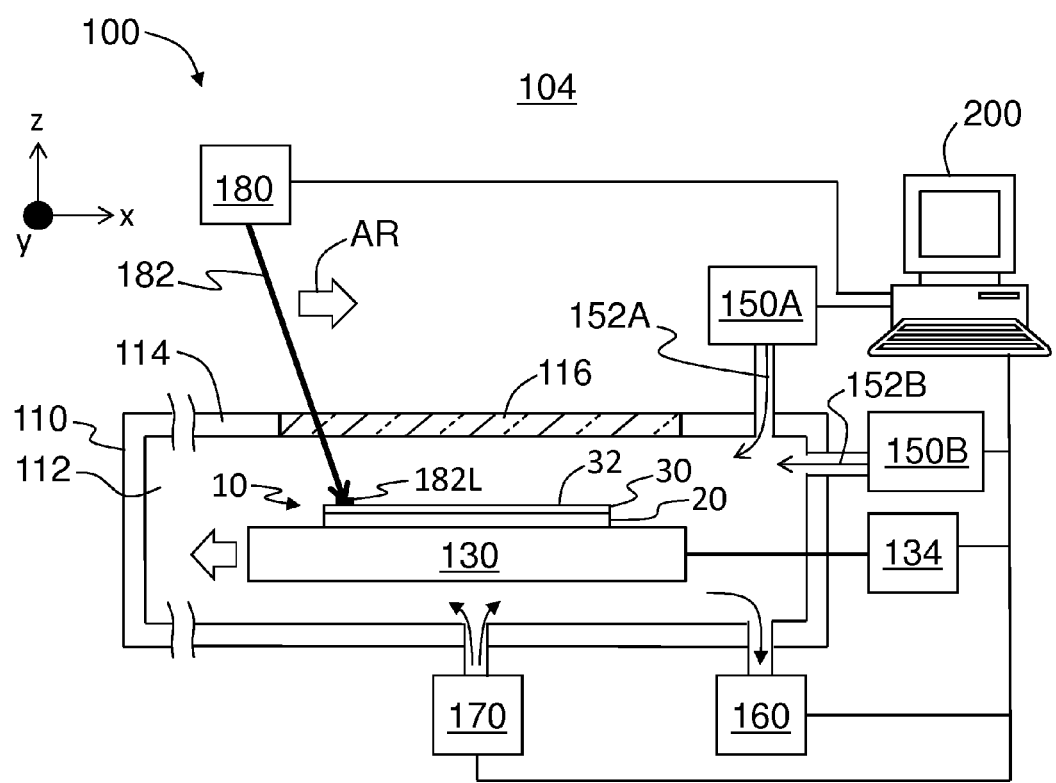
FIG. 3 is a schematic diagram of an example laser processing system used to carry out the methods of processing the patterned product wafer to improve at least one of the etch resistance and LER.

FIG. 3 is a schematic cross-sectional view of an example laser processing system 100 for processing patterned product wafer 10 to improve the performance of photoresist 30 with respect to at least one of LER and etch resistance, as compared to not processing the patterned product wafer.

The laser processing system 100 includes a process chamber 110 that has an interior 112 sized to accommodate patterned product wafer 10. The process chamber 110 has a top wall 114 that includes a window 116 that is transparent to a select wavelength range $\Delta\lambda$ that includes a process wavelength $\lambda$, as discussed below. In an example, window 116 is made of fused silica. The laser processing system 100 resides in an ambient environment 104. The process chamber 110 is configured to provide a controlled environment in chamber interior 112 for processing photoresist 30, as described below.

The patterned product wafer 10 is supported in chamber interior 112 by a wafer stage 130. In an example, wafer stage 130 is movable in the x, y and z directions and can also be rotated about the x, y and z axes as needed. The wafer stage 130 is operably connected to a wafer-stage driver 134.

The laser processing system 100 also includes at least one process-gas source 150 fluidly connected to chamber interior 112 and that emits at least one process gas 152. In an example, the at least one process gas 152 is a molecular gas. In the example laser processing system 100 of FIG. 3, first and second process-gas sources 150A and 150B that emit first and second process gasses 152A and 152B are shown by way of example. In an example, first process gas 152A is a molecular gas that comprises or consists of either trimethyl aluminum ($Al_2(CH3)_6$), or titanium tetrachloride ($TiCL_4$) or diethyl zinc (($C_2H_5$)$_2$Zn). Also in an example embodiment, second process gas 152B comprises water vapor, i.e., $H_2O$ gas. In an example, the water vapor can be a constituent of air or of another gas rather than being pure water vapor.

The laser processing system 100 also includes a vacuum system 160 fluidly connected to chamber interior 112. The vacuum system 160 is used to remove any gasses from the interior at select times during the processing of patterned product wafer 10, as described below.

The laser processing system 100 also includes an inert gas source 170 fluidly connected to chamber interior 112 and that can provide an inert gas 172 to perform a purge of first process gas 152A or second process gas 152B. In an example, inert gas 172 is nitrogen. This serves to remove the process gas 152A or 152B from the vicinity of photoresist layer 30 so that the process gas is no longer available to react with the photoresist layer.

The laser processing system 100 also includes a laser system 180 that generates a laser beam 182 having the process wavelength $\lambda$. In an example, laser beam 182 can scan, as illustrated by arrow AR. The laser processing system 100 may include beam-conditioning optics (not shown), which may include beam-scanning elements and components (e.g., a scanning mirror).

Figure 4:
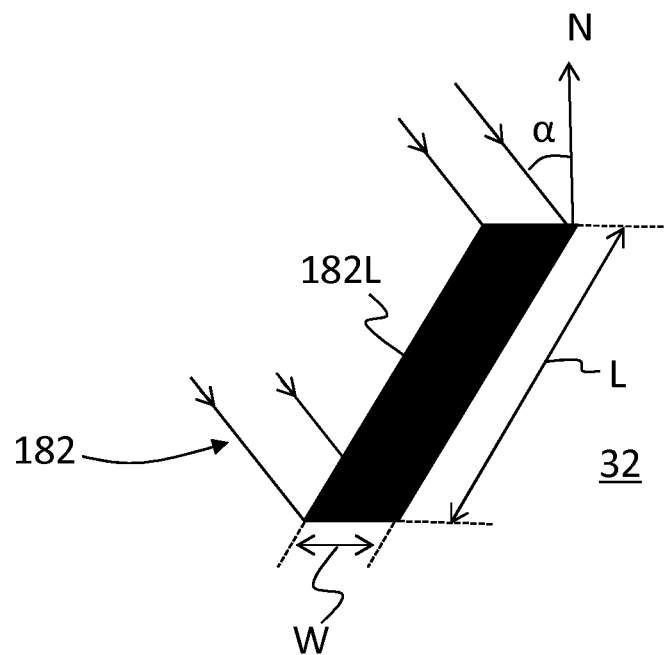
FIG. 4 is an elevated view of an example laser beam that forms a line image at the photoresist surface having a width W and a length L.

FIG. 4 is an elevated view of an example line image 182L formed by laser beam 182 when the laser beam intersects photoresist surface 32, as explained below. The line image 182L has a width W and a length L. The width W and length L of line image 182L depends on the illumination angle of incidence a measured relative to the normal N of photoresist surface 32.

In an example, laser system 180 generates laser beam 182 having the following parameters, as summarized in Table 1.

TABLE 1

Example laser-beam parameters

| Parameter | Range |
| --- | --- |
| Beam width W | 0.1 mm to 2 mm |
| Beam length L | 10 mm to 100 mm |
| Dwell time $\tau$ | 1 to 100 milliseconds (ms) |
| Process wavelength $\lambda$ | 300 nm to 1,200 nm |
| Power density P | 50 to 150 watts/mm$^2$ |
| Scan speed $v_s$ | 10 to 5,000 mm/s |

Figure 5:
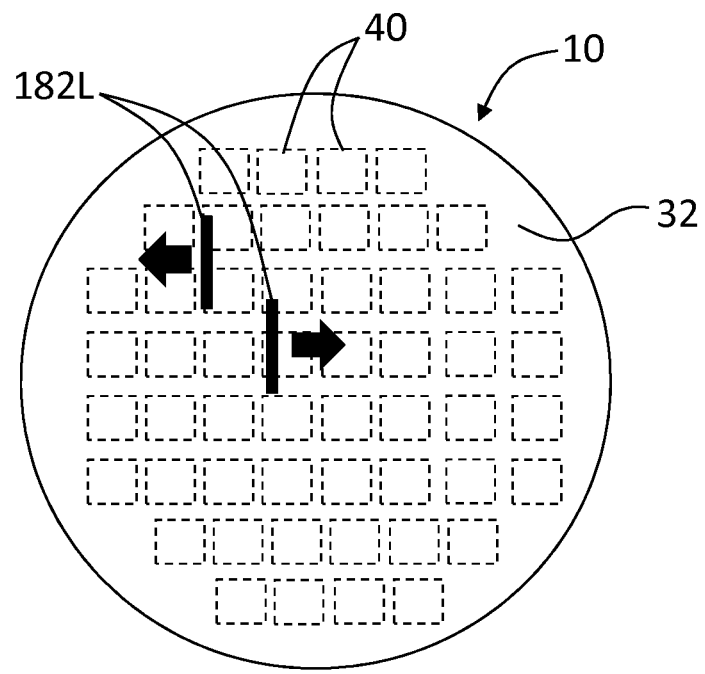
FIG. 5 is a plan view of the photoresist layer of the patterned product wafer undergoing laser scanning during one of the process steps.

In Table 1, the dwell time τ is the length of time line image 182L resides over a point on photoresist surface 32. The scan speed $v_s$ is the speed at which line image 182L moves over photoresist surface 32. FIG. 5 is a top-down view of patterned product wafer 10 illustrating how line image 182L moves over photoresist surface 32. The movement of line image 182L relative to photoresist surface 32 can be effectuated by moving (scanning) laser beam 182, by moving wafer stage 130 or by a combination of these movements. In an example, the scanning of laser beam 182 is in a back-and-forth manner, e.g., in a boustrophedonic manner or raster-scan manner.

The laser processing system 100 also includes a controller 200 operably connected to at least one of process-gas sources 150A and 150B, to wafer-stage driver 134, to vacuum system 160, to inert gas source 170 and to laser system 180 to control the overall operation of the laser processing system in processing patterned product wafer 10. In an example, controller 200 is or includes a computer, such as a personal computer or workstation. The controller 200 preferably includes any of a number of commercially available microprocessors, a suitable bus architecture to connect the processor to a memory device, such as a hard disk drive, and suitable input and output devices (e.g., a keyboard and a display, respectively). The controller 200 can be programmed via instructions (software) embodied in a computer-readable medium (e.g., memory, processor or both) that cause the controller to carry out the various functions of laser processing system 100 to effectuate processing of patterned product wafer 10.

In the operation of laser processing system 100 to process patterned product wafer 10, in a first step, vacuum system 160 is operated to remove ambient gas in chamber interior 112 to create an initial condition for initiating the process, e.g., wherein the chamber interior contains less than 100 parts per million (ppm) of oxygen. Once the initial condition is established, then in a second step, first process gas 152A is introduced into chamber interior 112 where the first process gas interfaces with photoresist surface 32.

Next, in a third step, laser beam 182 is scanned (e.g., raster scanned) over patterned product wafer 10, i.e., line image 182L is scanned over photoresist surface 32. In an example, this laser-scanning operation raises the temperature of photoresist 30 to between 300° C. and 500° C. within a temperature uniformity of +/−5° C. This causes molecules of the first process gas 152A to infuse into photoresist 30. For the example parameters set forth in Table 1, it can take from about 30 seconds to about 120 seconds to scan the entire patterned process wafer 10. This time period is referred to herein as the "wafer process time."

This part of the method or process is similar to an atomic layer deposition (ALD) process whereby monotomic layers of a material are deposited onto a surface and then reacted to affect the surface as well as a portion of the underlying volume. In the present case, the infusion of trimethyl aluminum has been shown to improve the etch resistance of photoresist. However, as discussed above, the prior-art process for performing the infusion is done slowly at low temperature. Here, the infusion into the volume of photoresist 30 is done in a matter of milliseconds.

It is noted here that the short dwell time τ of laser-beam line image 182L prevents photoresist 30 from flowing so that photoresist pattern 50 is maintained. The laser beam 182 thus serves to raise the surface temperature of photoresist 30 to selectively deposit ALD-type material onto photoresist surface 32 or into the bulk of the photoresist.

Once laser-beam line image 182L is scanned over photoresist surface 32 (see FIG. 5), then in a fourth step, the first process gas 152A that remains in the vicinity of photoresist layer 30 is removed. This can be accomplished by evacuating chamber interior 112 using vacuum system 160. Alternatively, or in combination with the vacuum evacuation, the fourth step may include activating inert gas source 170 and flushing chamber interior 112 with inert gas 172.

Then, in a fifth step (which may be optional, depending on the type of first process gas 152A used), second process gas 152B is introduced into chamber interior 112. As noted above, in an example, second process gas 152B is a molecular gas and comprises water vapor ($H_2O$).

Next, in a sixth step, laser-beam line image 182L is scanned over photoresist surface 32 to cause infusion of $H_2O$ molecules into photoresist layer 30. In a seventh step, second process gas 152B is removed from chamber interior 112 in one of the manners described above.

Steps two through seven can be repeated as many times as is required to achieve the desired degree of improvement in one or both of LER and etch resistance.

In example embodiments, the following first and second process gases can be used: 1) trimethyl aluminum and water vapor to infuse aluminum or sapphire, $Al_2O_3$; 2) titanium tetrachloride and water vapor to infuse Ti or TiO; and 3) diethyl zinc and water vapor to infuse zinc or ZnO.

The second process gas 152B in the form of water vapor is used to create the metal oxide. In an example, the infusion of the trimethyl aluminum, titanium tetrachloride or diethyl zinc into photoresist 30 is performed without introducing second process gas 152B to form an etch barrier.

Figure 6:
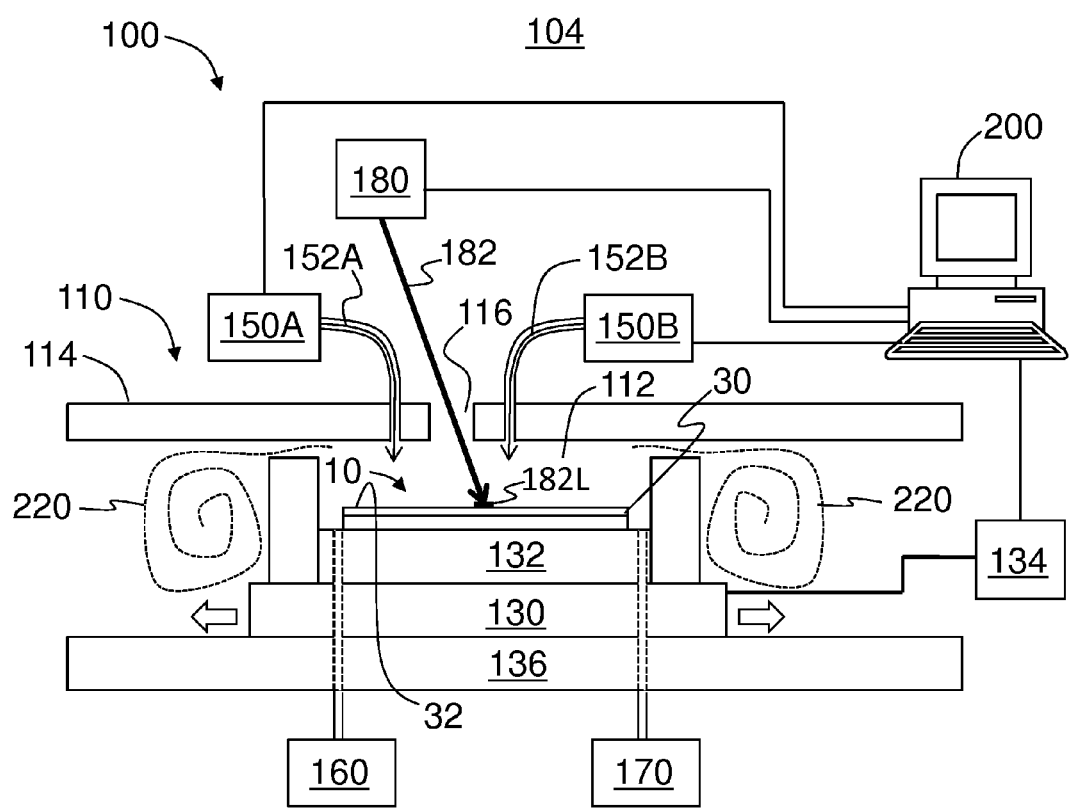
FIG. 6 is similar to FIG. 3 and shows an alternate embodiment of the process chamber in the form of a microchamber.

FIG. 6 is similar to FIG. 3 and illustrates an alternative embodiment of laser processing system 100 wherein process chamber 110 is in the form of a microchamber, such as those disclosed in U.S. Pat. No. 5,997,963, entitled "Microchamber" and U.S. patent application Ser. No. 13/690,132, entitled "Movable microchamber with gas curtain." The wafer stage 130 is shown supporting a chuck 132, which in turn supports patterned product wafer 10. A platen 136 movably supports movable wafer stage 130. The top wall 114 includes window 116 sized to pass laser beam 182. In an example, laser beam 182 is incident upon photoresist 30 at an angle other than normal incidence.

In an example, an air curtain 220 is employed to prevent ambient gas (such as oxygen) in ambient environment 104 from entering chamber interior 112, which in an example is not otherwise sealed off from the ambient environment of process chamber 110. For a microchamber process chamber 110, the original gas residing in interior 112 is pushed out by flooding the interior with the particular process gas (i.e., gas 152A or 152B). In an example, inert gas 112 from inert gas source 170 is used to flush out the original gas (e.g., air) or to flush out the process gas between the process steps.

Once patterned product wafer 10 is processed using one of the processes described above, it has at least one of improved etch resistance and, or the LER as compared to a patterned product wafer that has not been so processed. At this point, the processed patterned product wafer 10 can be subjected to a standard semiconductor manufacturing etch process along the way to forming semiconductor devices.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of improving on a patterned product wafer at least one of an etch resistance and a line-edge roughness of a photoresist layer having a surface, comprising:
   a) exposing the photoresist layer to a first process gas comprising either trimethyl aluminum $(Al_2(CH3)_6)$ gas, titanium tetrachloride $(TiCL_4)$ gas or diethyl zinc $((C_2H_5)_2Zn)$ gas;
   b) laser irradiating the photoresist layer and the first process gas to cause the first process gas to infuse into the photoresist layer, wherein the photoresist surface is raised to a temperature of between 300° C. and 500° C. with a temperature uniformity of +/−5° C.;
   c) removing remaining first process gas from a vicinity of the photoresist layer;
   d) exposing the photoresist layer to a second process gas comprising $H_2O$; and
   e) laser irradiating the photoresist layer and second process gas to cause the $H_2O$ to infuse into the photoresist layer, wherein the photoresist surface is raised to a temperature of between 300° C. and 500° C. with a temperature uniformity of +/−5° C.

2. The method according to claim 1, wherein the laser irradiating includes scanning a laser beam over the surface of the photoresist layer.

3. The method according to claim 1, wherein the scanning includes either moving the laser beam, moving the patterned product wafer or moving both the laser beam and the patterned product wafer.

4. The method according to claim 2, wherein the laser beam forms a line image at the photoresist surface.

5. The method according to claim 4, wherein the line image has a dwell time $\tau$ in the range $1\ ms \leq \tau \leq 100\ ms$.

6. The method according to claim 4, wherein the line image has a width W in the range $0.2\ mm \leq W \leq 2\ mm$ and a length L in the range $10\ mm \leq L \leq 100\ mm$.

7. The method according to claim 4, wherein the line image has a scan speed $v_s$ in the range $20\ mm/s \leq v_s \leq 5{,}000\ mm/s$.

8. The method according to claim 4, wherein the laser beam has a power density P in the range $50\ watts/cm^2 \leq P \leq 150\ watts/cm^2$.

9. The method according to claim 1, wherein the patterned product wafer is maintained in an interior of a process chamber.

10. The method according to claim 1, further comprising etching the processed patterned product wafer.

11. The method according to claim 1, wherein steps a) through e) are carried out over the entire wafer in a wafer process time of between 30 seconds and 120 seconds.

12. The method according to claim 1, wherein steps a) through e) are repeated one or more times, with an additional step of removing the second process gas from the vicinity of the photoresist layer after each step e).

13. The method according to claim 1, wherein the product wafer resides within a process chamber interior, and wherein removing the first process gas from the vicinity of the photoresist layer includes at least one of evacuating the first process gas from the chamber interior and purging the chamber interior with an inert gas.

14. A method of processing a product wafer residing in an interior of a process chamber and having a patterned photoresist layer with a surface to improve at least one of an etch resistance and a line-edge roughness, comprising:
   a) exposing the surface of the photoresist layer to a first molecular process gas;
   b) scanning a laser beam over the surface of the photoresist layer to cause infusion of molecules of the first molecular process gas into the photoresist layer, wherein the photoresist surface is raised to a temperature of between 300° C. and 500° C. with a temperature uniformity of +/−5° C.;
   c) removing remaining first molecular process gas from the chamber interior;
   d) exposing the photoresist layer to a second molecular process gas and repeating step b) for the second molecular process gas; and
   wherein the first molecular process gas is one of trimethyl aluminum $(Al_2(CH3)_6)$ gas, titanium tetrachloride $(TiCL_4)$ gas or diethyl zinc $((C_2H_5)_2Zn)$ gas, and the second molecular process gas comprises $H_2O$.

15. The method according to claim 14, wherein the laser beam forms a line image at the photoresist surface, and wherein the line image has a dwell time $\tau$ in the range $1\ ms \leq \tau \leq 100\ ms$.

16. The method according to claim 15, wherein the line image has a width W in the range $0.2\ mm \leq W \leq 2\ mm$ and a length L in the range $10\ mm \leq L \leq 100\ mm$.

17. The method according to claim 15, wherein the line image has a scan speed $v_s$ in the range $20\ mm/s \leq v_s \leq 5{,}000\ mm/s$.

18. The method according to claim 14, wherein the laser beam has a power density P in the range $50\ watts/cm^2 \leq P \leq 150\ watts/cm^2$.

19. The method according to claim 14, further comprising etching the processed patterned product wafer.

20. The method according to claim 14, wherein steps a) through d) are carried out over the entire wafer in a wafer process time of between 30 seconds and 120 seconds.

21. The method according to claim 14, wherein removing the first molecular process gas from the chamber interior includes at least one of evacuation of the first molecular process gas from the chamber interior and purging the chamber interior with an inert gas.

22. A method of processing a product wafer residing in an interior of a process chamber and having a patterned photoresist layer having a surface to improve at least one of an etch resistance and a line-edge roughness, comprising:
   a) sequentially introducing first and second molecular process gases to the process chamber interior, including removing the first or second molecular process gas from the process chamber interior prior to introducing the other of the first or second molecular process gas;
   b) laser scanning the photoresist surface for each of the first and second molecular gases to cause the sequential infusion of the first and second molecular gases into the photoresist layer; and
   c) repeating steps a) and b) multiple times, wherein the first molecular gas is either trimethyl aluminum $(Al_2(CH3)_6)$, titanium tetrachloride $(TiCL_4)$ or diethyl zinc $(C_2H_5)_2Zn)$, and the second molecular gas comprises water vapor.

23. The method according to claim 22, wherein the laser scans are performed using a laser beam that forms a line image, and wherein the line image has a dwell time $\tau$ in the range $1\ ms \leq \tau \leq 100\ ms$.

24. The method according to claim 23, wherein the line image has a width W in the range $0.2\ mm \leq W \leq 2\ mm$ and a length L in the range $10\ mm \leq L \leq 100\ mm$.

25. The method according to claim 23, wherein the line image has a scan speed $v_s$ in the range $20\ mm/s \leq v_s \leq 5{,}000\ mm/s$.

26. The method according to claim 23, wherein the laser beam has a power density P in the range $50\ watts/cm^2 \leq P \leq 150\ watts/cm^2$.

27. The method according to claim 22, wherein removing the first or second molecular process gas from the chamber interior includes at least one of: i) evacuation of the first or second molecular process gas from the chamber interior and ii) purging the chamber interior with an inert gas.

28. A method of processing a product wafer residing in an interior of a process chamber and having a patterned photoresist layer having a surface to improve at least one of an etch resistance and a line-edge roughness, comprising:
   a) exposing the surface of the photoresist layer to a first process gas comprising molecules, wherein the first process gas molecules are selected from the group of molecules comprising: trimethyl aluminum ($Al_2(CH3)_6$) gas, titanium tetrachloride ($TiCL_4$) gas or diethyl zinc (($C_2H_5)_2Zn$) gas; and
   b) scanning a laser beam over the surface of the photoresist layer to cause infusion of the molecules of the first process gas into the photoresist layer, wherein the photoresist surface is raised to a temperature of between 300° C. and 500° C. with a temperature uniformity of +/−5° C.

29. The method according to claim 28, further comprising after step b):
   c) removing the first process gas from the chamber interior;
   d) exposing the photoresist layer to a second process gas containing $H_2O$ molecules; and
   e) scanning the laser beam over the surface of the photoresist layer to cause infusion of the $H_2O$ molecules into the photoresist layer.

30. The method according to claim 28, wherein removing the first process gas from the chamber interior includes at least one of: i) evacuating the first or second molecular process gas from the chamber interior and ii) purging the chamber interior with an inert gas.

31. The method according to claim 28, wherein scanning laser beam forms a line image having a dwell time $\tau$ in the range $1\ ms \le \tau \le 100\ ms$.

32. The method according to claim 31, wherein the line image has a width W in the range $0.2\ mm \le W \le 2\ mm$, a length L in the range $10\ mm \le L \le 100\ mm$, a scan speed $v_s$ in the range $20\ mm/s \le v_s \le 5{,}000\ mm/s$, and a power density P in the range $50\ watts/cm^2 \le P \le 150\ watts/cm^2$.

33. The method according to claim 28, wherein steps a) and b) are carried out over the entire product wafer in a wafer process time of between 30 seconds and 120 seconds.

* * * * *